(12) United States Patent
Osaka et al.

(10) Patent No.: US 7,957,150 B2
(45) Date of Patent: Jun. 7, 2011

(54) SUPPORT METHOD AND APPARATUS FOR PRINTED CIRCUIT BOARD

(75) Inventors: Hideki Osaka, Oiso (JP); Yutaka Uematsu, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 71 days.

(21) Appl. No.: 12/361,761

(22) Filed: Jan. 29, 2009

(65) Prior Publication Data

US 2009/0213558 A1 Aug. 27, 2009

(30) Foreign Application Priority Data

Feb. 21, 2008 (JP) ................................. 2008-039504

(51) Int. Cl.
 *H05K 1/00* (2006.01)
(52) U.S. Cl. .......... 361/748; 361/782; 174/260; 716/10; 716/11; 716/102; 716/112; 716/115; 716/118; 716/119; 716/122; 716/128; 324/627; 324/750
(58) Field of Classification Search .................. 361/748, 361/782; 174/260; 716/5, 6, 11, 15, 1, 9, 716/102, 112, 115, 118, 119, 122, 128, 130; 324/627, 750
See application file for complete search history.

(56) References Cited

U.S. PATENT DOCUMENTS

| 7,114,132 | B2 * | 9/2006 | Yaguchi | 716/1 |
|---|---|---|---|---|
| 7,120,885 | B2 * | 10/2006 | Nakayama et al. | 716/9 |
| 7,168,058 | B2 * | 1/2007 | Harada et al. | 716/15 |
| 7,240,319 | B2 * | 7/2007 | Bentley et al. | 716/11 |
| 7,353,483 | B2 * | 4/2008 | Hamada et al. | 716/15 |
| 7,428,717 | B1 * | 9/2008 | Duong | 716/6 |
| 2001/0018761 | A1 * | 8/2001 | Sasaki et al. | 716/15 |
| 2002/0176989 | A1 * | 11/2002 | Knudsen et al. | 428/408 |
| 2006/0282811 | A1 * | 12/2006 | Fujimura | 716/15 |
| 2007/0062726 | A1 * | 3/2007 | Chang et al. | 174/260 |

FOREIGN PATENT DOCUMENTS

| JP | 10-207926 | 8/1998 |
|---|---|---|
| JP | 2000-293560 | 10/2000 |
| JP | 2001-147952 | 5/2001 |
| JP | 2004-145410 | 5/2004 |
| JP | 2004-362074 | 12/2004 |

* cited by examiner

*Primary Examiner* — Xiaoliang Chen

(74) *Attorney, Agent, or Firm* — Antonelli, Terry, Stout & Kraus, LLP.

(57) ABSTRACT

An orthogonal array is formed by performing electromagnetic field analysis only once and determining a range by using the mount position and type of a capacitor and the number of capacitors as parameters to perform circuit analysis a small number of times. An estimation equation is formed by using as an index a result of the absolute value of the calculated power source impedance, and a capacitor is disposed to reduce noises by using the estimation equation.

3 Claims, 16 Drawing Sheets

130-a

SUPPORT METHOD AND APPARATUS FOR PRINTED CIRCUIT BOARD

INCORPORATION BY REFERENCE

The present application claims priority from Japanese application JP2008-039504 filed on Feb. 21, 2008, the content of which is hereby incorporated by reference into this application.

BACKGROUND OF THE INVENTION

The present invention relates to a printed circuit board noise calculating method and a design support apparatus using a CAD program for a printed circuit board having semiconductor devices and decoupling capacitors constituting an information processing apparatus such as a personal computer, a server, a router and a storage.

Important guide lines for designing a printed circuit board include realizing functions provided by mounted components, reducing power source noises, reducing electromagnetic radiation from an apparatus, and the like. Reducing power source noises are particularly important from the viewpoint of ensuring stable operations of components mounted on a printed circuit board, such as semiconductor devices, analog devices and RF components. It is also important to suppress power source noises because the power source noises may become an exciting source of electromagnetic radiation noises.

A flow chart illustrated in FIG. 2 is generally used as a printed circuit board design method which can suppress electromagnetic radiation noises by optimizing a board layout. Namely, after a startup, board information is input at Step 110, and component arrangement information is input at Step 120. By using these two pieces of the information, an electromagnetic field is analyzed at Step 130 to model the board. This model and a semiconductor device model are connected to analyze noises at circuit analysis Step 150. Power source noises greatly dependent upon board layout so that component arrangement can therefore be estimated at a design stage. It is judged at Step 200 whether the estimated power source noises are larger or smaller than a target value. If noises exceed the target value, the component is rearranged at Step 210. Information after the component is rearranged at Step 210 is processed by a sequence of the electromagnetic field analysis Step 130 and following Step which are repeated until the judgment Step 200 is satisfied.

Component arrangement optimizing techniques are disclosed, for example, in JP-A-2001-147952 and JP-A-2004-362074. According to these techniques, after layout of a printed circuit board, models of a power source system and a ground system are formed through electromagnetic field analysis, and the two-dimensional distribution of voltage and current in the board is displayed to identify excessive noise regions. A capacitor is disposed near the excessive noise region to reduce noises.

JP-A-2000-293560 discloses techniques of speeding up electromagnetic field analysis and circuit analysis. Electromagnetic field analysis (FDTD) and circuit analysis (SPICES) are performed alternately at each step to improve an analysis precision of devices including an IC circuit.

A circuit design method disclosed in JP-A-2004-145410 allows even a person not skilled in an analog circuit to perform an optimum circuit constant design taking a circuit variation into consideration, by using Taguchi methods.

JP-A-10-207926 discloses a design approach using an orthogonal array.

SUMMARY OF THE INVENTION

The above-cited techniques are associated with the following problems.

A design flow of the techniques disclosed in JP-A-2001-147952, JP-A-2004-362074 and JP-A-2000-293560 is similar to that illustrated in FIG. 2. Namely, in order to design a low noise printed circuit board, it is necessary to perform the electromagnetic analysis 130 and circuit analysis 150 each time a component is rearranged (Step 220). Therefore, a turn-around-time (TAT) of total design is long and a design cost is increased. There is therefore an issue that as the number of components increases, the number of processes increases exponentially. This is because, as the number of components increases, the number of component arrangement combinations increases so that the electromagnetic field calculation and circuit calculation increase the number of design processes. There is also another issue that processes are forced to be terminated before the design is optimized and that many noise eliminating components are required to be mounted.

According to the technique disclosed in JP-A-2004-145410, even a person not skilled in an analog circuit can perform an optimum circuit constant design considering a circuit variation. However, there is no description on application to a printed circuit board design method aiming as low noises. It is not definite in selecting what design parameter for application to the printed circuit board design, in selecting what worst conditions, and in modeling through electromagnetic field analysis. The disclosed technique itself can not be applied to the printed circuit board design. The same issue is also associated with JP-A-10-207926.

It is an object of the present invention to provide a method of designing a printed circuit board with low power source noises, and allow even a person not skilled in the art to design at a short TAT.

The following method of the present invention settles the above-described issues. Namely, electromagnetic analysis taking a long time in a design process is performed only once. Similarly, circuit analysis taking a long time is not performed at each component rearrangement, but an orthogonal array is formed by using parameters of the type of component, a component position and the number of components. All combinations of these parameters (all parameter sets) are concentrated by forming the orthogonal array, and the circuit analysis is performed only for the concentrated parameter sets. Because of this concentration, even if the number of components increases, the number of processes will not increase exponentially. Power source noises are calculated by using as the evaluation index, the absolute values of the power source impedances of obtained by the circuit analysis at a resonance frequency and an antiresonance frequency. The evaluation index for each parameter set is formulated. With formulation, the power source impedances and power source noises of all parameter sets can be analyzed on the equation basis so that analysis time can be shortened.

Even if a designer is not a skilled designer, the designer can try an analysis with short TAT a plurality of times so that it is possible to design a printed circuit board with low noises.

By applying the present invention to design of a multilayer board of an information processing apparatus such as a personal computer, a server, a router and a storage, and home information appliances, a design cost of the apparatus can be lowered. Since a try can be performed a number of times, an optimum arrangement realizing lower power source noises can be derived, and a stable operation and low radiation noise characteristic of a product can thus be acquired.

Other objects, features and advantages of the invention will become apparent from the following description of the embodiments of the invention taken in conjunction with the accompanying drawings.

DESCRIPTION OF THE EMBODIMENTS

First Embodiment

The first embodiment will be described with reference to FIGS. 1 to 8.

Figure 1:
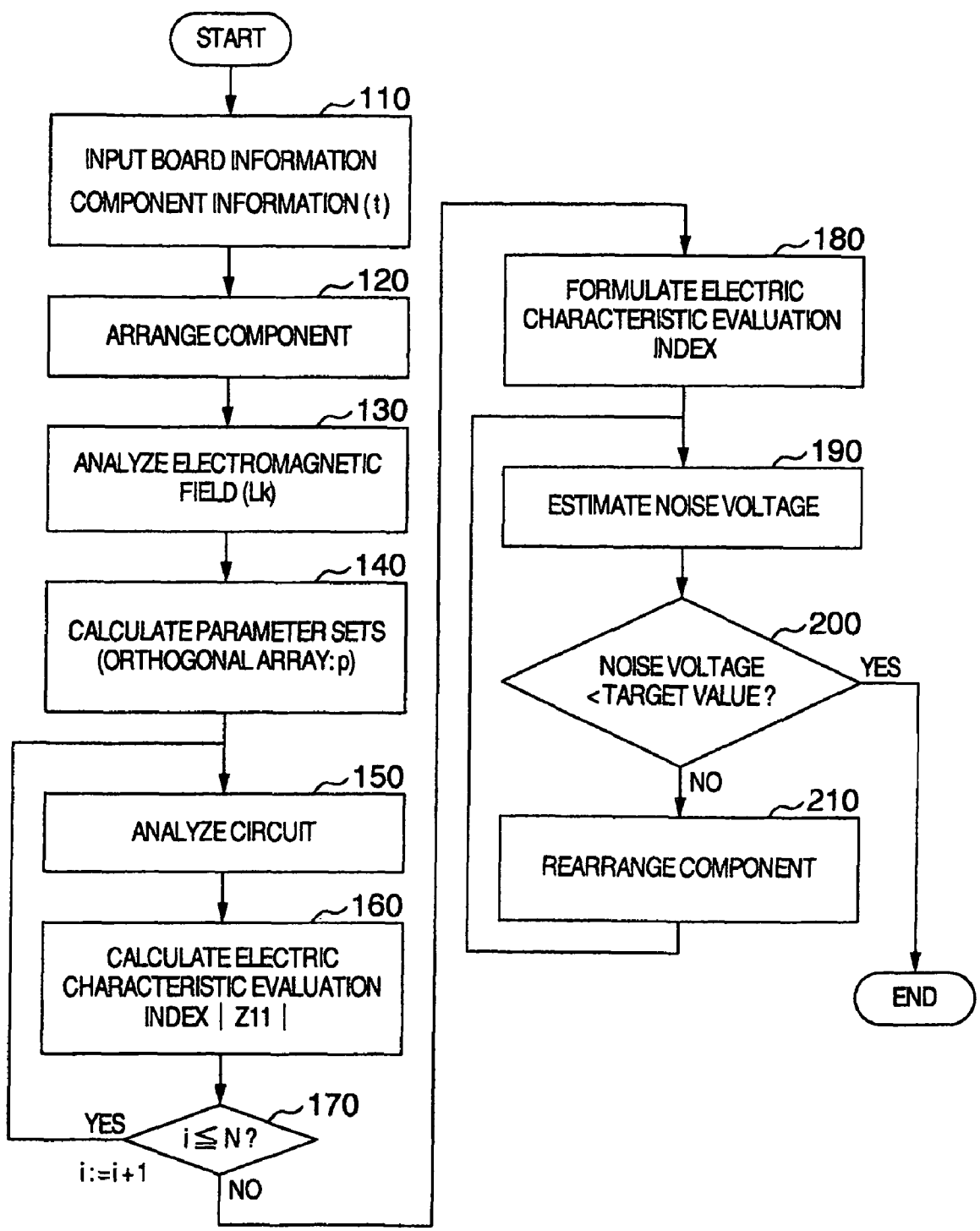
FIG. 1 is a flow chart illustrating a printed circuit board design method according to a first embodiment.
Figure 2:
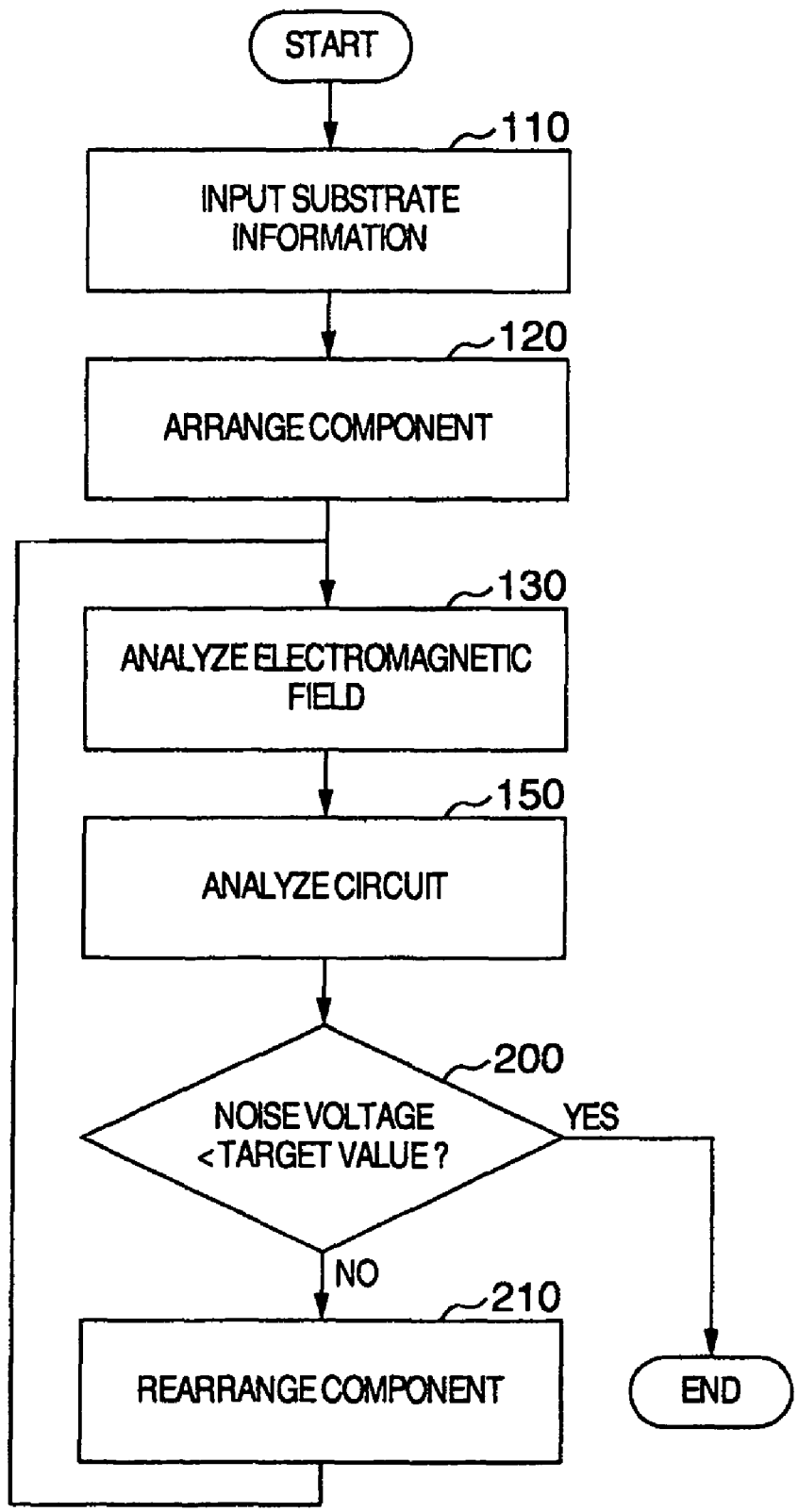
FIG. 2 is a flow chart illustrating a conventional printed circuit board design method.

FIG. 1 is a flow chart illustrating a printed circuit board design method according to the invention. This flow chart will be described first, and then each process will be described in detail.

In a substrate information inputting process 110, design information of a printed circuit board necessary for printed circuit board design is input, including outer shape information of the printed circuit board, the number of layers, shape information of via holes and the like. At this stage, a wiring design rule and the like not shown are prepared in advance, including circuit connection information (net list), component list information, a wiring inhibition shortest distance, and the like. By using the net list and component list, a component arranging process 120 is executed. The component list includes information on each semiconductor device providing a function and information on each decoupling component to be connected to each semiconductor device to stabilize the power source and reduce power source noises. In the component arranging process 120, components having a large size such as semiconductor devices, components having a large consumption power and components being sensitive and easy to improperly respond to power source noises are arranged tentatively, and decoupling capacitors are arranged tentatively around these components. In this process, a board layout is performed in some cases, including setting an outer shape of the printed circuit board, dividing power source wirings of different power sources.

Next, an electromagnetic analyzing process 130 is performed relative to the shapes of a power source layer and a ground layer, or a plane (hereinafter simply called a power source plane), disposed in the printed circuit board. The power source plane is meshed and an inductance matrix (Lk) of each mesh is obtained.

Next, a parameter set calculating process 140 forms an orthogonal array (p) by using as parameters the type (t) of a decoupling capacitor, the number (n) of decoupling capacitors and an inductance corresponding to arrangement. The number of parameter sets formed by the orthogonal array is N. This number N is characterized in that N is much smaller than all combinations of the parameters.

A circuit analyzing process 150 forms an equivalent circuit model corresponding to the parameter sets to perform electric circuit analysis of the power source plane and calculate the power source impedances (Z11) of the whole printed circuit board as seen from a power source terminal of each semiconductor device. The power source impedances (Z11) include the impedances at a resonance frequency and an antiresonance frequency. There is a property that the impedance Z11 at the antiresonance frequency becomes high. Therefore, the absolute value |Z11| of the power source impedance at the antiresonance frequency (f0) is calculated, and is used as the electric characteristic evaluation index corresponding to a parameter set. These calculating processes 150 and 160 are repeated the number (N) of parameter sets to obtain evaluation indices |Z11| of the parameter sets.

Next, an electric characteristic evaluation index formulating process 180 formulates a calculation equation for the power source impedance applicable to all combinations of the parameters, by using the evaluation index |Z11|. Generally, this calculation equation can be calculated at high speed because it is represented by a polynomial equation having an order of (level number—1) and using the parameters as variables.

Next, a noise voltage estimating process 190 calculates power source noises relative to component arrangement. This calculation is obtained from a product of the absolute value |Z11| of the power source impedance for each parameter set calculated previously and power source noise current components (I(f)) generated by the semiconductor device at an antiresonance frequency (f). Namely, a noise voltage is given by:

Noise voltage: $Vn(f)=|Z11| \times I(f)$ (1)

A judging process 200 judges whether the noise voltage (Vn) is not larger than a target value set by a user. If the noise voltage is larger than the target value, a component rearranging process 210 rearranges the component. In accordance with new component arrangement information, the process 190 estimates the noise voltage. The processes 190 to 210 are repeated until the noise voltage becomes not larger than the target value. The process is terminated after the noise voltage becomes not larger than the target value.

Next, each process will be described in detail.

Figure 3:
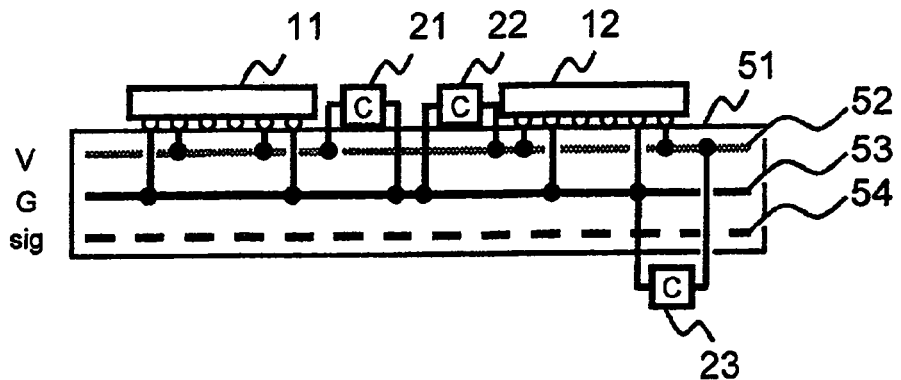
FIG. 3 is a cross section view illustrating the structure of a printed circuit board to be designed according to the first embodiment.

First, in order to facilitate understanding, an example of a cross section of a printed circuit board as a design target is illustrated in FIG. 3. Semiconductor devices 11 and 12 are mounted on a bare board 51 of a printed circuit board, and are connected to a power source layer 52 and a ground layer 53 in the board 51. Signal wirings are established by a signal wiring layer 54. Decoupling capacitors 21, 22 and 23 are mounted near at the semiconductor devices 11 and 12 to stabilize a power source voltage, i.e., to reduce power source noises. The decoupling capacitors may be disposed on either the upper surface of the board 51 or the lower surface.

Figure 4:
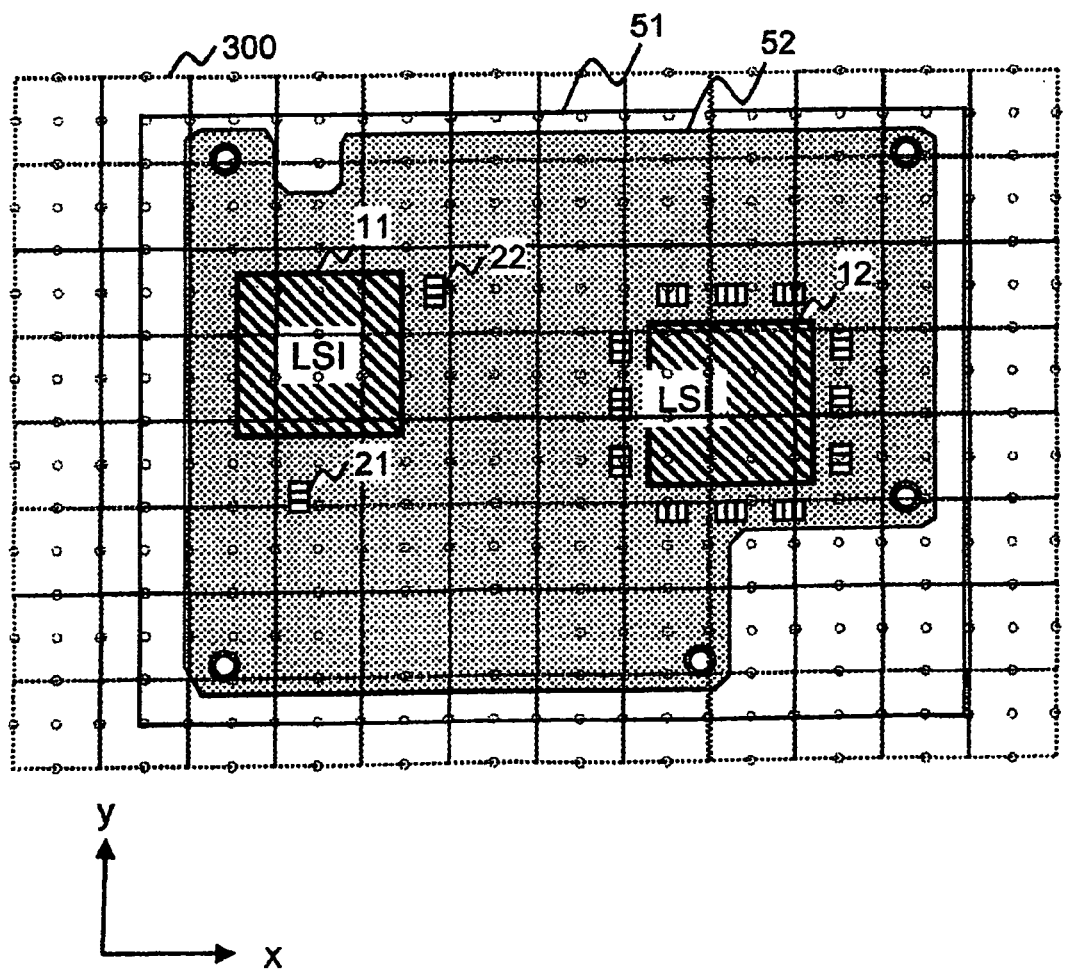
FIG. 4 is a top view of the printed circuit board illustrating meshes for electromagnetic analysis.
Figure 5:
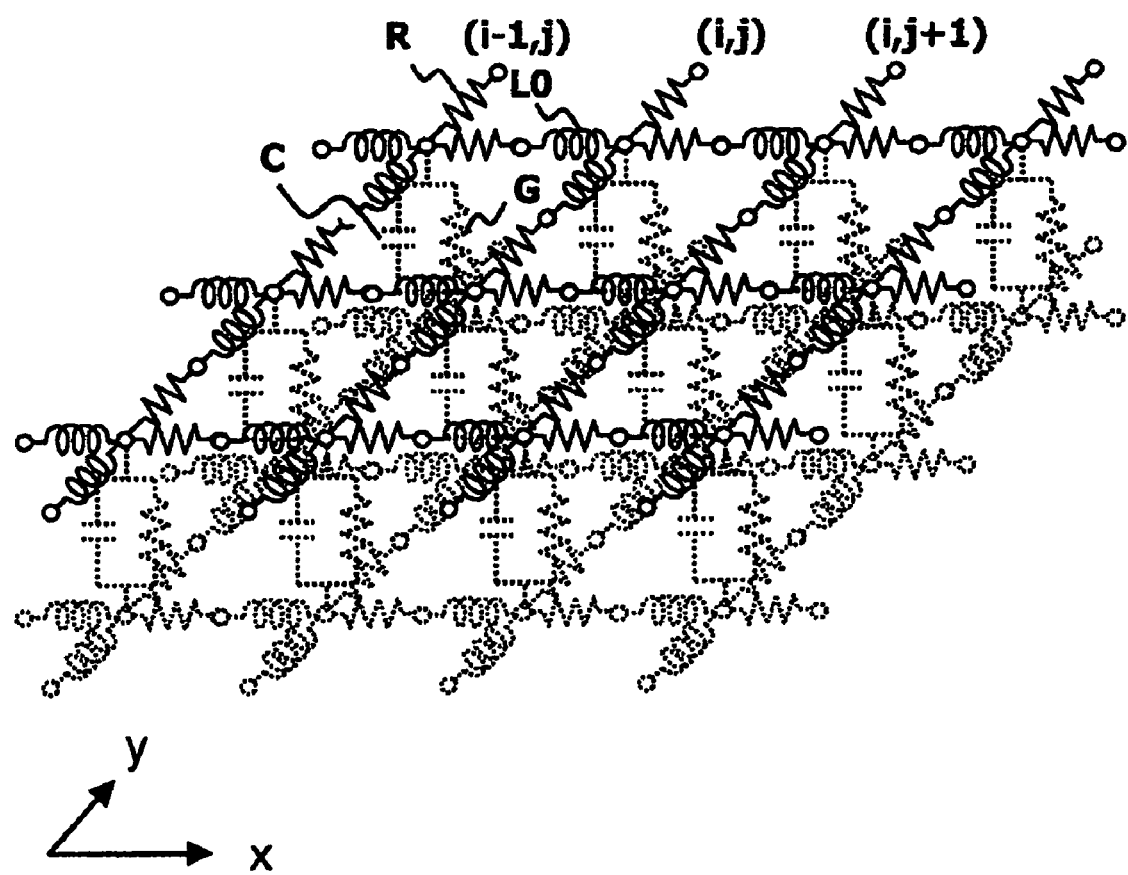
FIG. 5 is a calculated equivalent circuit of the printed circuit board explaining the printed circuit board design method of the first embodiment.
Figure 5:

FIG. 4 is a top view of a target printed circuit board. Semiconductor devices 11 and 12 indicated by hatched lines are mounted on the bare board 51 of a printed circuit board, and decoupling capacitors 21 and 22 are mounted near at the semiconductor device 11. Dotted lines and small circles represent meshes 300 formed in the electromagnetic field analyzing process 130.

As described above, the board information input process 110 is the same as a general printed circuit board design process, and the duplicated description will be omitted.

The component arranging process 120 tentatively arranges components such as semiconductor devices 11 and 12 and decoupling capacitors 21 and 22 on the bear board 51 of a printed circuit board illustrated in FIGS. 3 and 4. In this case, although all components are not required to be arranged, components relevant to power source noises are required to be tentatively arranged.

In the electromagnetic field analyzing process 130, as illustrated in FIG. 4, the bare board 51 of the printed circuit board is divided by the meshes 300, a resistance (R), an inductance (L), a conductance (G) and a capacitance (C) are calculated for each mesh in accordance with a power source pattern shape and film thickness information of the power source layer 52 and ground layer 53. Terminals of each of the meshes 300 are assigned numbers, e.g., in FIG. 5, (i, j), (i+1, j) and the like. This electromagnetic analyzing process 130 obtains values of the constants R, L, G and C in each mesh through electromagnetic field calculations. The calculated equivalent circuit of each mesh is connected at terminals to constitute an equivalent circuit 130-a (FIG. 5) between the power source plane 52 and ground plane 53 of the printed circuit board 51.

Next, the parameter set calculating process 140 calculates an inductance (L) existing between the position of a semiconductor device and the position where a capacitor can be arranged, by using the inductance matrices (Lk) obtained by the electromagnetic analyzing process 130.

Description will be made on a case wherein the semiconductor device 11 illustrated in FIG. 4 is selected as the target semiconductor device for which power source noises are desired to be reduced. When the decoupling capacitor 21 for the semiconductor device 11 is to be mounted on the printed circuit board 51, an area on which the decoupling capacitor 21 can be mounted is defined by design rules of printed circuit boards defining interference with other components and a minimum arrangement distance between components. The characteristics of a decoupling capacitor of the semiconductor device 11 is determined from the inductance (L) existing up to the position of the capacitor. This is because power source noises of the semiconductor device 11 are proportional to a power source impedance as seen from the semiconductor device as represented by the equation (1), and a maximum value of the power source impedance appears at an antiresonance frequency.

Figure 6:
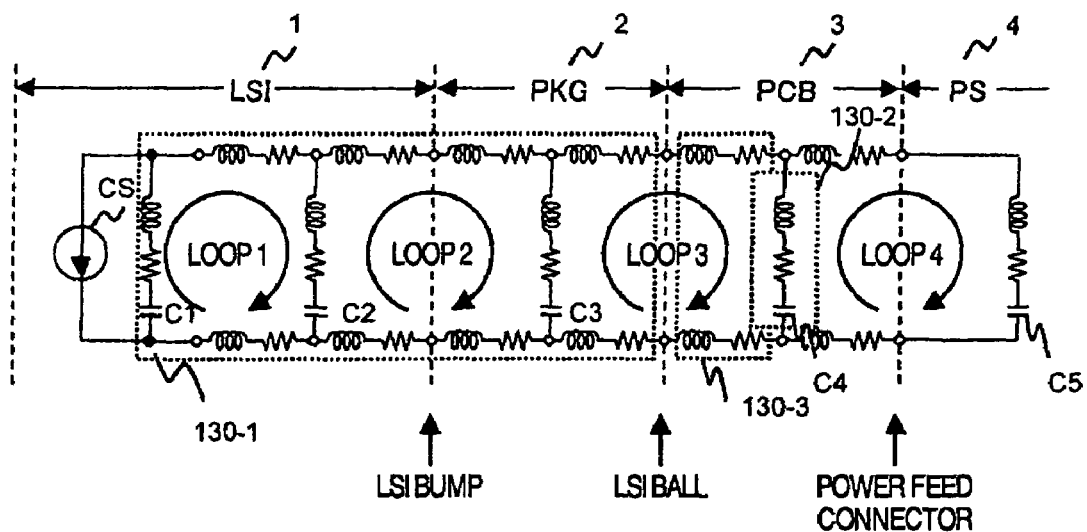
FIG. 6 is an equivalent circuit of power source planes of the printed circuit board.
Figure 7:
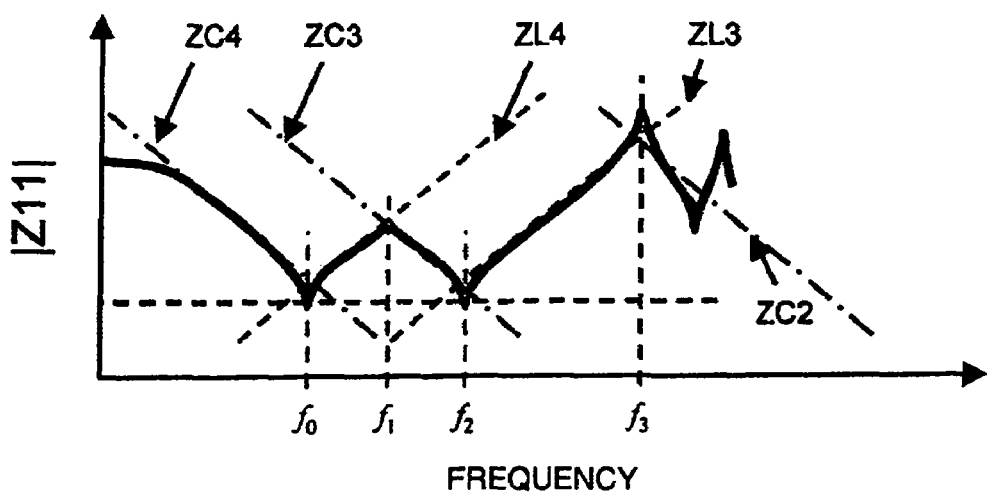
FIG. 7 is a characteristic diagram illustrating a frequency dependency of a power source impedance of the printed circuit board.

FIG. 6 represents an equivalent circuit of the substrate illustrated in FIG. 4, and FIG. 7 represents a frequency dependency of the absolute value |Z11| of the power source impedance as seen from the semiconductor device 11. A portion indicated at a level 1 in FIG. 6 represents an equivalent circuit of a semiconductor chip. A power source fluctuation to be caused by switching of a switching element in the semiconductor chip is represented by a current source (CS), and on-chip capacitances are represented by C1 and C2. Each of the capacitances has parasitic inductance components and parasitic resistance components. These components are generally cascade-connected.

A portion indicated at a level 2 represents an equivalent circuit of a semiconductor package, and an inductance, a resistance and a capacitor C3 are connected in a character shape of alphabet "H". A portion indicated at a level 3 corresponds to an equivalent circuit of the printed circuit board 51, and similarly a capacitance C4 and other parasitic components are connected in a character shape of "H". Similarly, a portion indicated at a level 4 corresponds to an equivalent circuit of a power feeding circuit, and external wirings and a power source to be connected via connectors of the power source wiring on the printed circuit board. An equivalent circuit of the semiconductor device 11 is represented by 130-1 indicated by a dotted line, an equivalent circuit of the capacitors 21 and 22 is represented by 130-2, and an equivalent circuit of a portion from the level 1 to level 3 is represented by 130-3.

FIG. 7 illustrates an example of a power source impedance as seen from the semiconductor device. The power source impedance is characterized in that convex and concave portions are repeated along a frequency domain, a bottom of the concave portion corresponds to a resonance frequency, and a peak of the convex portion corresponds to an antiresonance frequency. In the example illustrated in FIG. 7, a first resonance frequency f0, a first antiresonance frequency f1, a second resonance frequency f2, and so on appear from the low frequency side. As well known in the electric circuit theory, resonance and antiresonance are generated by inductances and capacitances connected in parallel.

An impedance ZL of an inductance L and impedance (ZC) of a capacitance C are given by the following equations:

$ZL = j\omega L$ (2)

$ZC = 1/(j\omega C)$ (3)

and a resonance frequency ($\omega 0$) of LC is given by the following equation:

$\omega 0 = 1/\sqrt{(LC)}$ (4)

wherein j is a pure imaginary number, $\omega$ is an angular frequency, and there is a relation of $\omega = 2\pi f$ relative to the frequency f.

Therefore, inclinations of the impedances of the inductance (L) and capacitance (C) relative to the frequency (f) are opposite. In FIG. 7, broken lines ZL4 and ZL3 indicate the impedances of inductance, and one-dot chain lines ZC2, ZC3 and ZC4 indicate the impedances of capacitances. The values of the capacitance and inductance of an actual printed circuit board are different on a digit unit basis at each level. For example, a capacitance of the level 3 (PCB) is several hundred to several thousand μF, whereas a capacitance of the level 2 (PKG) is several to several ten μF even if on-package capacitor is mounted on the level 2, a capacitance of the level 1 (LSI) is about several μF at most. ZC2, ZC3 and ZC4 correspond mainly to larger capacitances of closed circuit loops 2, 3 and 4, respectively.

Similarly, the inductance is different on the digit unit basis. In the case of the inductance, since the area of a current flow path is proportional to crossing magnetic fluxes, it is possible to consider that the inductance is proportional to the area of the current flow path. For example, about 1 cm at the level 1 (LSI), about several cm at the level 2 (PKG), and about several ten cm at the level 3 (PCB). As above, since the printed circuit board has capacitances and inductances different on the digit unit basis at respective levels, the power source impedances are irregular also on the digit unit basis. Impedances at each resonance frequency and each antiresonance frequency depend upon a Q value (quality factor of each loop circuit), and a parasitic resistance value of each loop circuit depends upon a conductance value.

As described above, the inductance of the absolute value |Z11| of the power source impedance changes with a distance (an area of crossed fluxes) between the semiconductor device and a decoupling capacitor. Therefore, the power source impedance and power source noises change with a position at which the decoupling capacitor is arranged. Namely, in the equivalent circuit in FIG. 6, the decoupling capacitor corresponds to C4, and the position of the decoupling capacitor corresponds to the inductance of the loop 3.

Description will be made on the parameter set calculating process 140 illustrated in FIG. 1, with reference to FIG. 8.

Figure 9:
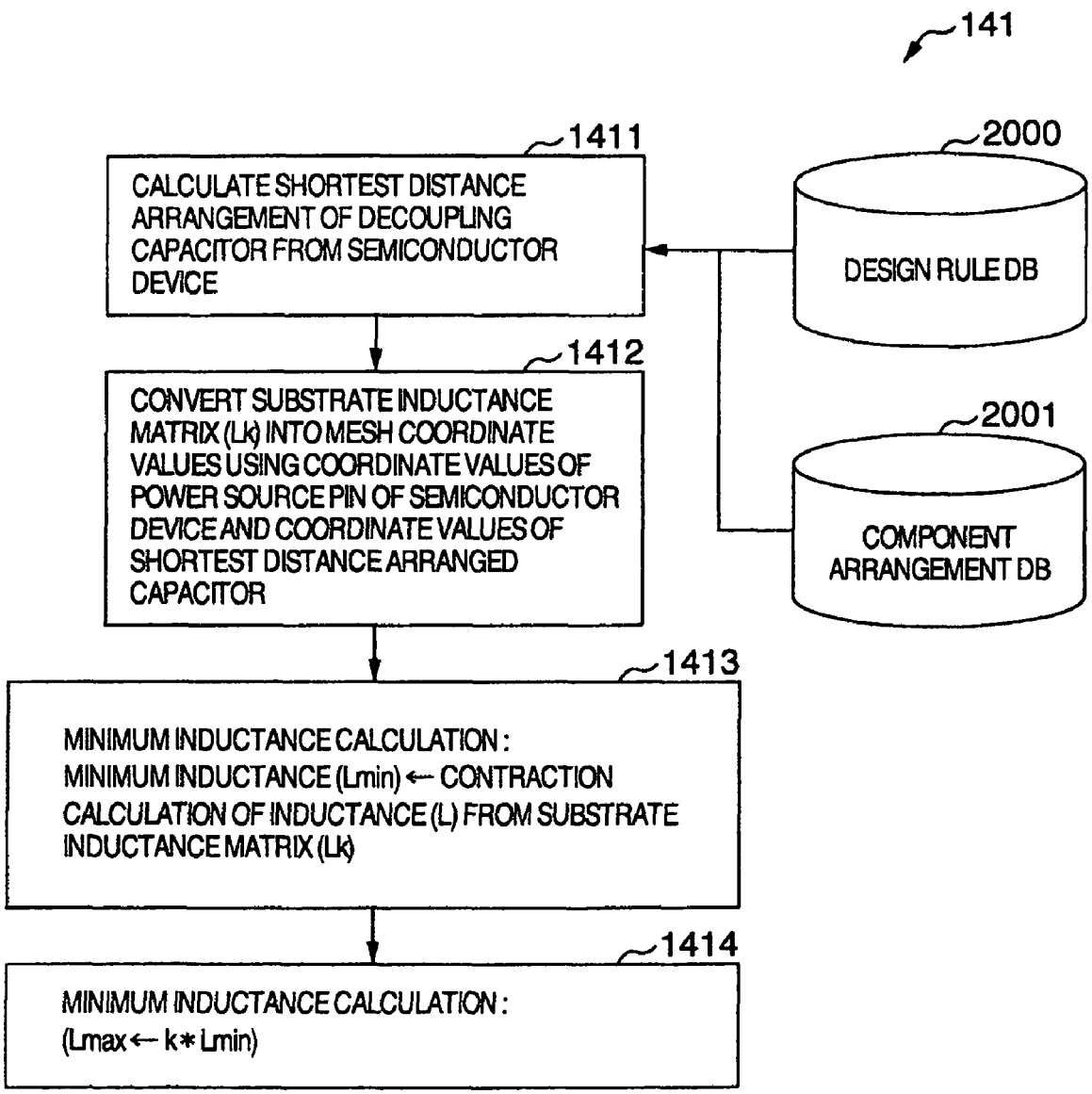
FIG. 9 is a flow chart illustrating the details of an inductance (L) range calculating process of the printed circuit board design method.

Calculated at Step 141 is a range of an inductance parameter (L) relative to the arrangement of the decoupling capacitor. This calculating Step 141 is executed as illustrated in FIG. 9. Namely, at Step 1411, shortest arrangement coordinate values of the decoupling capacitor to be mounted nearest to the semiconductor device 11 of the printed circuit board meshed as illustrate in FIG. 4 are calculated in accordance with the restriction conditions read from a design rule database 2000 and data read from a component arrangement database 2001.

At Step 1412, the coordinates values of the substrate are converted into mesh coordinate values of the equivalent circuit. Namely, assuming that the position of a power source pin of the semiconductor device 11 is represented by the coordinate values 1 and the position of the capacitor is represented by the coordinate values 2, by using the information on coordinate values of components on the printed circuit board, the coordinate values 1 and 2 are converted into mesh coordinate values (i1, j1) and (i2, j2) on the meshes of the equivalent circuit 130-a, respectively.

At Step 1413, a minimum inductance (Lmin) is calculated. In this calculation, an inductance (L) between two mesh coordinate values (i1, j1) and (i2, j2) corresponding to the shortest distance is calculated from the equivalent circuit 130-a illustrated in FIG. 5 by using an inductance matrix (Lk). With this calculation, the minimum inductance parameter (Lmin) sets the nearest arrangement position of the decoupling capacitor. At Step 1414, a maximum inductance (Lmax) is calculated. This parameter may by obtained from the remotest position from the semiconductor device on the substrate or may be obtained by setting a constant k to about 10 (k=10).

With these Steps, the range of the inductance parameter (L) can be designated.

Figure 8:
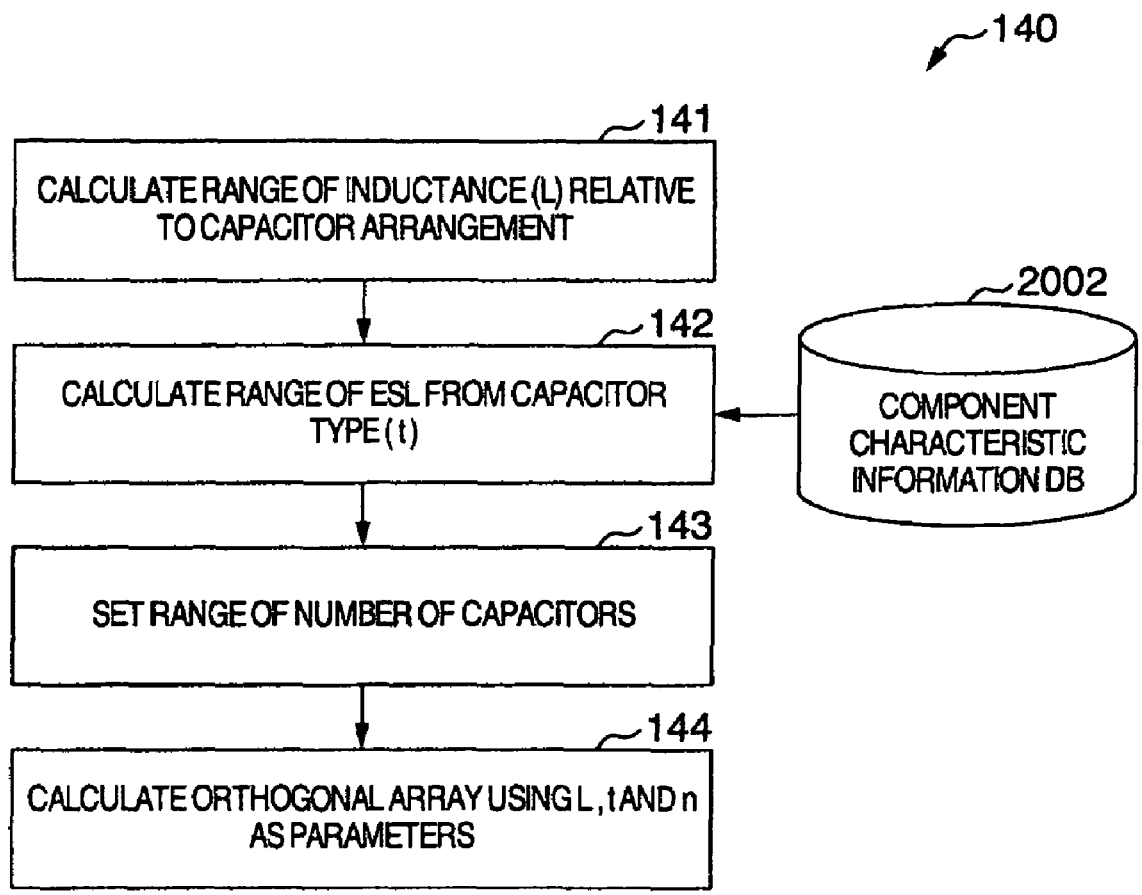
FIG. 8 is a flow chart illustrating the details of a parameter set calculating process of the printed circuit board design method.

Similarly, a range of a parasitic inductance is calculated at Step 142 illustrated in FIG. 8. Namely, information on the parasitic inductance (ESL) of the capacitor is obtained from a database 2002 storing the characteristics of capacitor components of all types used for printed circuit board, and a range between the maximum and minimum values of ESL.

Figure 10:
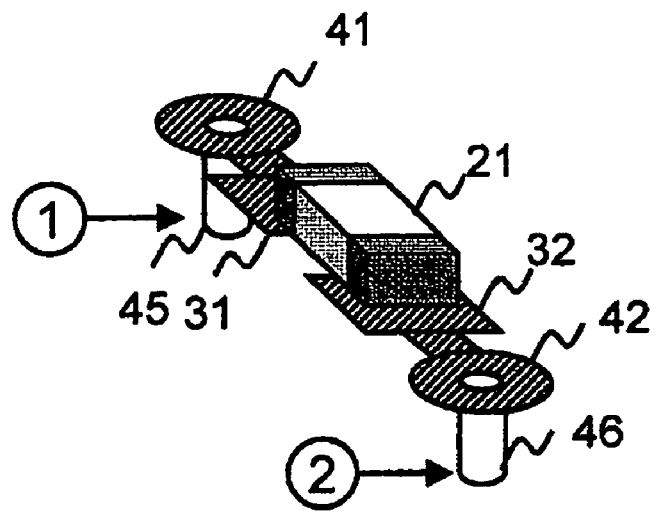
FIG. 10 is a mount diagram of decoupling capacitors mounted on the printed circuit board.
Figure 11:
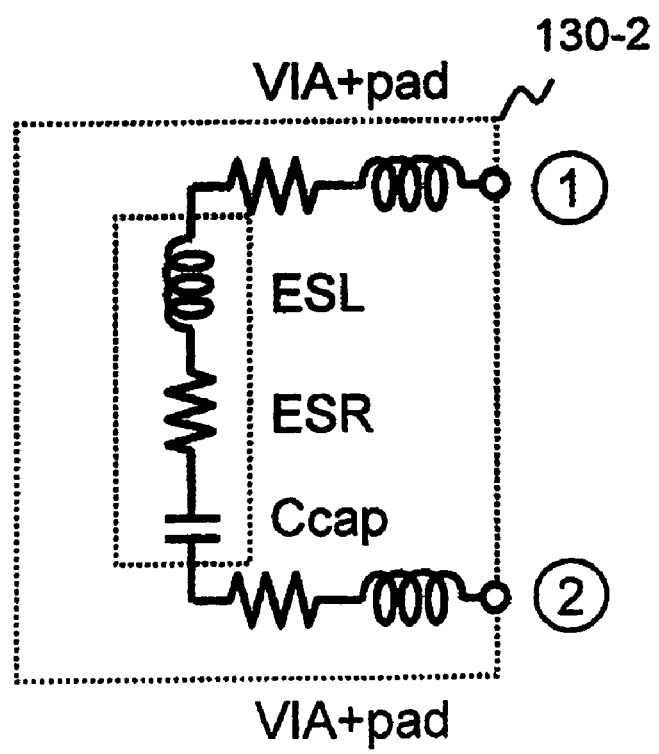
FIG. 11 is an equivalent circuit of a decoupling capacitor.

As illustrated in FIGS. 10 and 11, ESL may be calculated from a mount state. FIG. 10 is a mount diagram (perspective view) of a capacitor. A capacitor 21 is mounted on electrode pads 31 and 32. The pads 31 and 32 are led and connected to circular pads 41 and 42 which are electrodes for via cylindrical holes 45 and 46. One of the via holes 45 and 46 is connected to a power source layer of the printed circuit board 51, and the other is connected to the ground layer. These connection terminals are represented by circle numerals 1 and 2. An equivalent circuit 130-2 of the mounted capacitor can be represented by FIG. 11. Namely, the components between the circle numerals 1 and 2 are a serial connection of inductances and resistances of the via holes and pads, a parasitic resistance (ESR) and parasitic inductance (ESL) of the capacitor 21, and a capacitance (Ccap). A mount state of a capacitor is often known prior to a board layout design. Therefore, a parasitic inductance can be known beforehand through electromagnetic field analysis and modeling. This data is registered in the database 2002 and used for calculating a range of ESL at Step 142.

Next, at Step 143 illustrated in FIG. 8, a range of the number (n) of decoupling capacitors is set. This setting may be input from a user or the number n may be set in advance to a minimum of nmin=1 and a maximum of nmax=100.

At Step 144, an orthogonal array is formed by using three parameters (L, t, n) determined at Steps 141 to 143. For example, if each parameter has a maximum value, a minimum value and a median value and the orthogonal array is formed at the third level, nine parameter sets (p) are determined which are 1/third a total number of combinations of 3^3=27. A circuit analysis time can therefore be reduced considerably. The details of an orthogonal array are given in JP-A-2004-145410.

At Step 150 illustrated in FIG. 1, circuit analysis is performed for the parameter sets p (L, t, n). The circuit analysis is performed by using a simulator such as SPICE. The equivalent circuit illustrated in FIG. 6 is used. The inductance parameter (L) corresponding to a position of the decoupling capacitor is represented by the equivalent circuit 130-3. The decoupling capacitor is represented by the equivalent circuit 130-2 having a serial connection illustrated in FIG. 11 and corresponding to the type (t) of the decoupling capacitor. For the number n of decoupling capacitors, n equivalent circuits 130-4 are connected in parallel. Namely, as illustrated in FIG. 12, equivalent circuits 130-4 to 130-4n corresponding to the number n are inserted the node between the levels 2 and 3 for the circuit analysis calculation.

Figure 13:
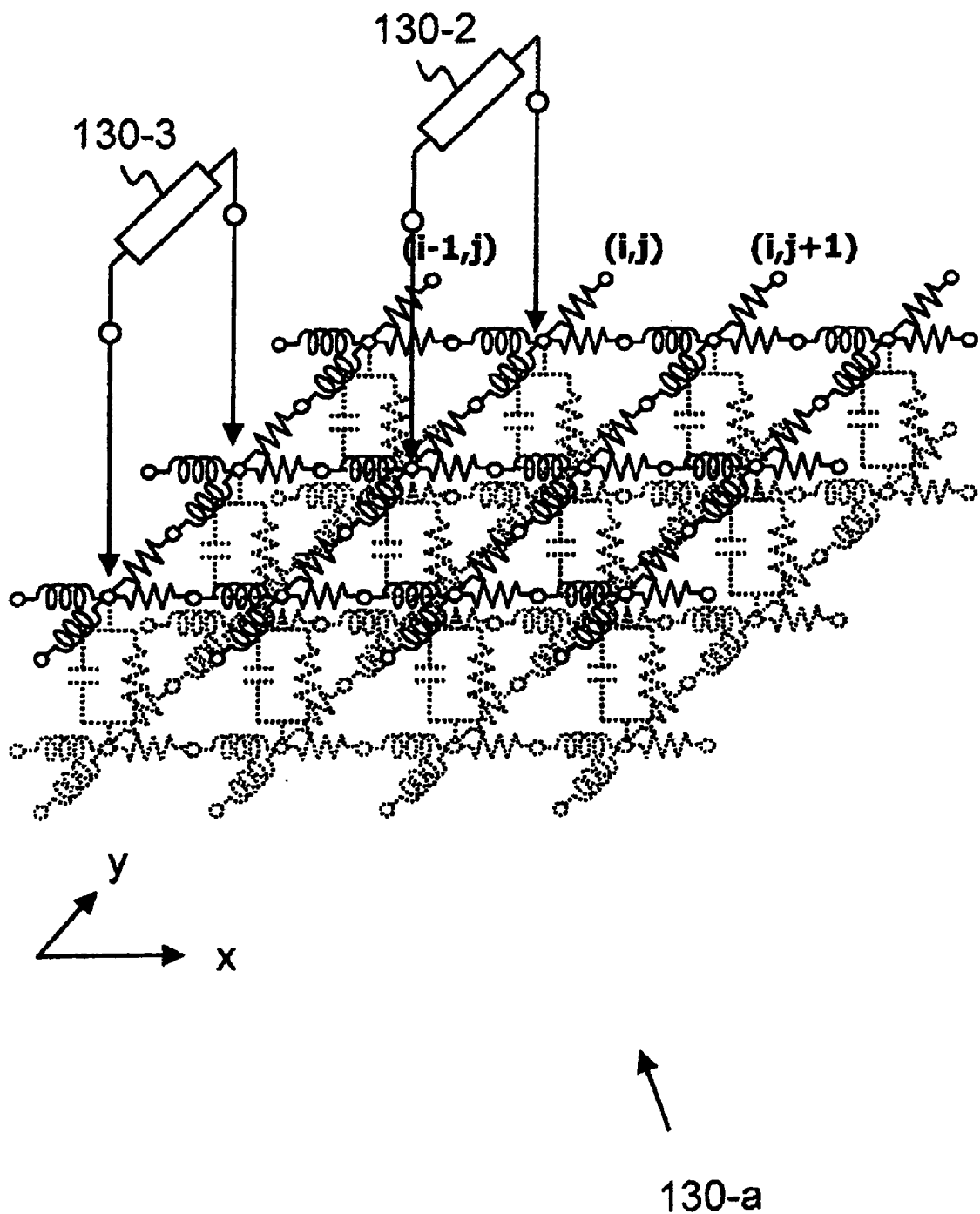
FIG. 13 is a connection diagram of equivalent circuits of a semiconductor device and a capacitor illustrating another example of the circuit analyzing process of the printed circuit board design method.

Calculation may be performed by using an equivalent circuit 130-a of the printed circuit board 51 as illustrated in FIG. 13. An equivalent circuit of a component is connected to the equivalent circuit 130-a of the printed circuit board 51 at coordinate values corresponding to the component position. For example, reference numeral 130-3 represents an equivalent circuit of the semiconductor device 11, and reference numeral 130-2 represents an equivalent circuit of the decoupling capacitor. The equivalent circuit 130-2 is connected to the mesh corresponding to the nearest position. In this case, since the inductance (L) parameter corresponding to the capacitor position has a linear relation to a distance (pattern length), a value of the inductance (L) is equivalent to that the capacitor is arranged on a circle having a radius corresponding to a distance between a power source pin of the semiconductor device 11, 12 and the capacitor. Namely, a range of a value of the inductance (L) can be converted again into a distance to the capacitor mount position.

Figure 12:
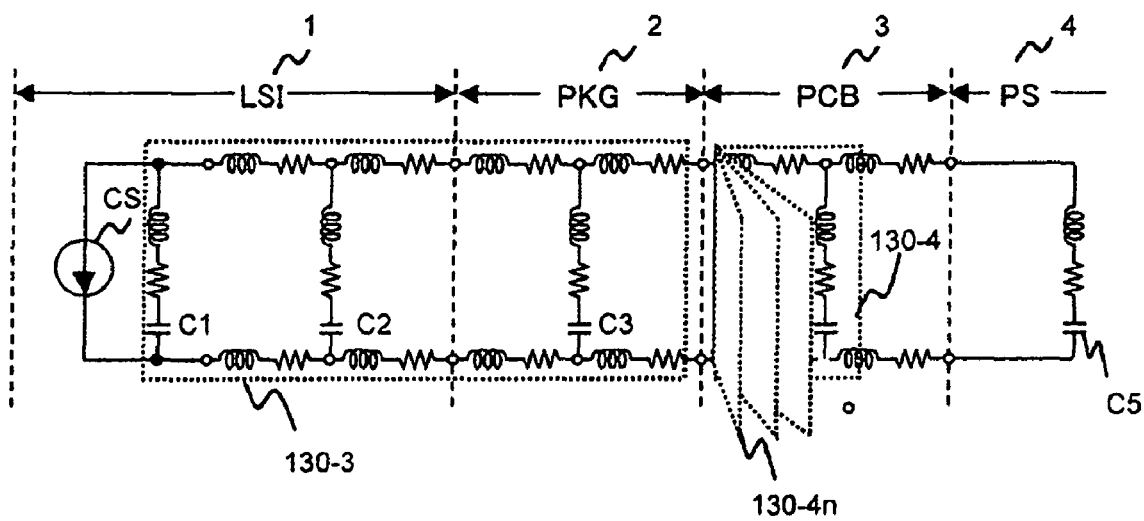
FIG. 12 is a power source system equivalent circuit having a plurality of capacitors and illustrating a circuit analyzing process of the printed circuit board design method.

Calculation at Step 150 in FIG. 1 can be performed by using the equivalent circuit illustrated in FIG. 6, 12 or 13. By using the results of circuit analysis 150, an index calculation 160 can be performed by using as the index the absolute value |Z11| of the power source impedance. A larger one of the absolute values |Z11| of the power source impedances at the antiresonance frequencies (f1 and f3) illustrated in FIG. 7 is used. In this manner, same indices are calculated for all the parameter sets (p).

At Step 180, an estimation equation for the absolute value |Z11| index of the power source impedance is calculated at each parameter (L, t, n) of the parameter sets (p). This calculation method is detailed in JP-A-10-207926. By using the parameters as variables, the Z11 estimation equation (5) is given by:

$$Z11 = |Z11(p)| = |Z11(L, t, n)| = a0 + \Sigma(a_i \cdot L\char`^ i + b_i \cdot t\char`^ i + c_i \cdot n\char`^ i)$$
$$(i = 1 \ldots 2) \quad (5)$$

having an effective precision in the range of Lmin<L<Lmax, ESLmin<t<ESLmax, and nmin<n<nmax. In this equation, a0 is a constant, ai, bi and ci are coefficients of each parameter (L, t, n), and i is an integral number, in equation (5) i is from 1 to 2. If necessary, an interaction such as a product of L and n may be defined and a secondary term may be added to the estimation equation to improve the precision. This Step 180 can obtain the absolute value |Z11| of the power source impedance as the electric characteristic evaluation index, through arithmetic calculation without electromagnetic field analysis, for every and all combinations of the parameters if in the range of each parameter.

At Step 190 in FIG. 1, a noise voltage is estimated by using the estimation equation (5).

This estimation is calculated by substituting Z11 for each parameter set (p) into the equation (1). Since this calculation is arithmetic calculation, calculation can be performed at high speed.

It is judged at Step 200 in FIG. 1 whether the noise voltage is not larger than the target value. If the noise voltage is larger than the target value, a component is rearranged at Step 210 to follow a sequence of re-estimation of the noise voltage at Step 190 and target voltage judgment at Step 200.

Figure 14:
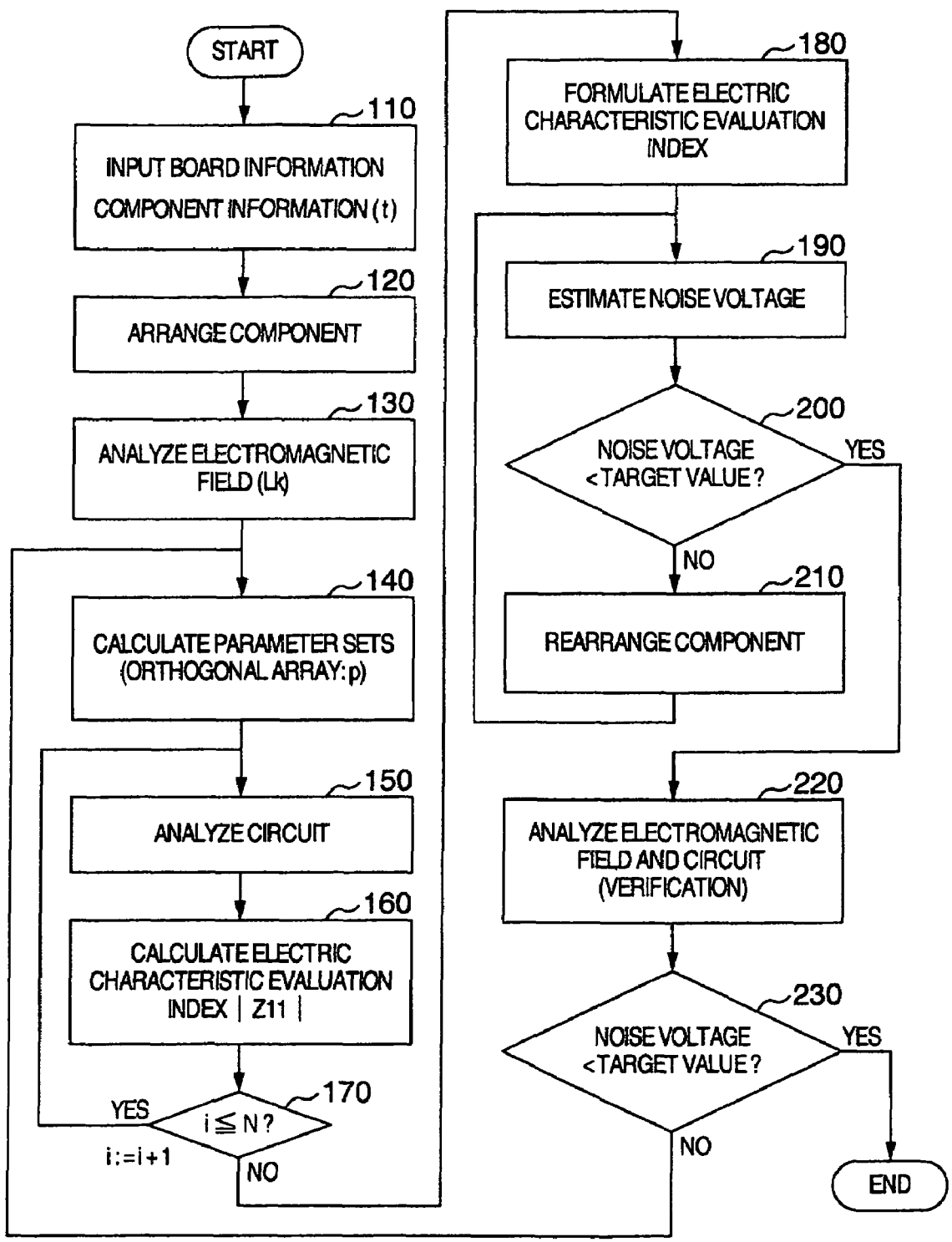
FIG. 14 is a flow chart illustrating a modification of the printed circuit board design method with an additional verification process.

As illustrated in FIG. 14, a verification process 220 may be added. After the noise voltage after component rearrangement on the estimation equation basis becomes lower than the target value at the judgment Step 200, it is verified whether the noise voltage in the final component arrangement becomes lower than the target value.

Namely, by performing electromagnetic field analysis and circuit analysis for the final component arrangement, it becomes possible to verify at high precision whether the power source noises for the final component arrangement are actually lower than the target value. Therefore, even if the estimation equation obtained at Step 180 contains many errors, the design precision can be ensured because electromagnetic field analysis and circuit analysis are performed at Step 220.

After the detailed verification is performed at Step 220, if it is judged at Step 230 that the noise voltage is larger than the target value, the flow returns to Step 140 whereat parameter sets are calculated again by narrowing the parameter range. Concentration of parameter sets can therefore be performed with short TAT.

In this embodiment, the power source noises are estimated by using the absolute value |Z11| of the power source impedance as the electric characteristic evaluation index and the equation (1). Instead of this method, the power source noises may be calculated by the circuit analysis 150, and the maximum value (Vn) of variable noises may be used as the electric characteristic evaluation index to be obtained as Step 160. Formulation at Step 180 using Vn is given from the same concept as the equation (5) by:

$$Vn = Vn(p) = Vn(L, t, n) = a0 + \Sigma(a_i \cdot L\char`^ i + b_i \cdot t\char`^ i + c_i \cdot n\char`^ i) \quad (6)$$

where i=1 ... 2, Lmin<L<Lmax, ESLmin<t<ESLmax, and nmin<n<nmax.

In this case, at Step 190, arithmetic calculation of the equation (6) is performed. Similarly, the parameter set (p) is not limited only to (L, t, n), but a size of a package, the number of balls, a signal/ground ratio and the like may be selected. This arrangement improves the degree of design freedom, and ensures the essence of short TAT design without repetition of circuit analysis.

Second Embodiment

Figure 15:
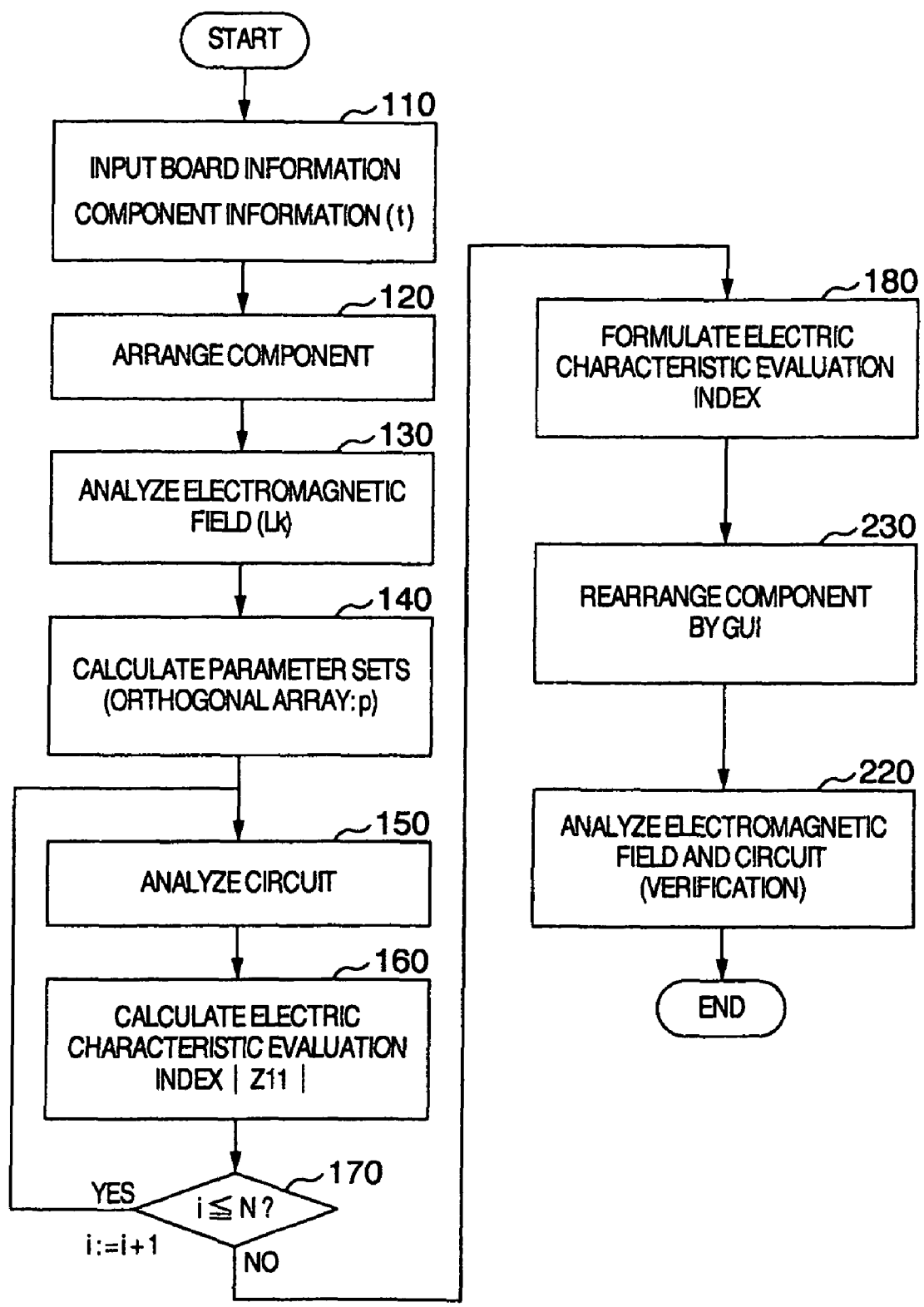
FIG. 15 is a flow chart illustrating a printed circuit board design method according to a second embodiment.
Figure 16:
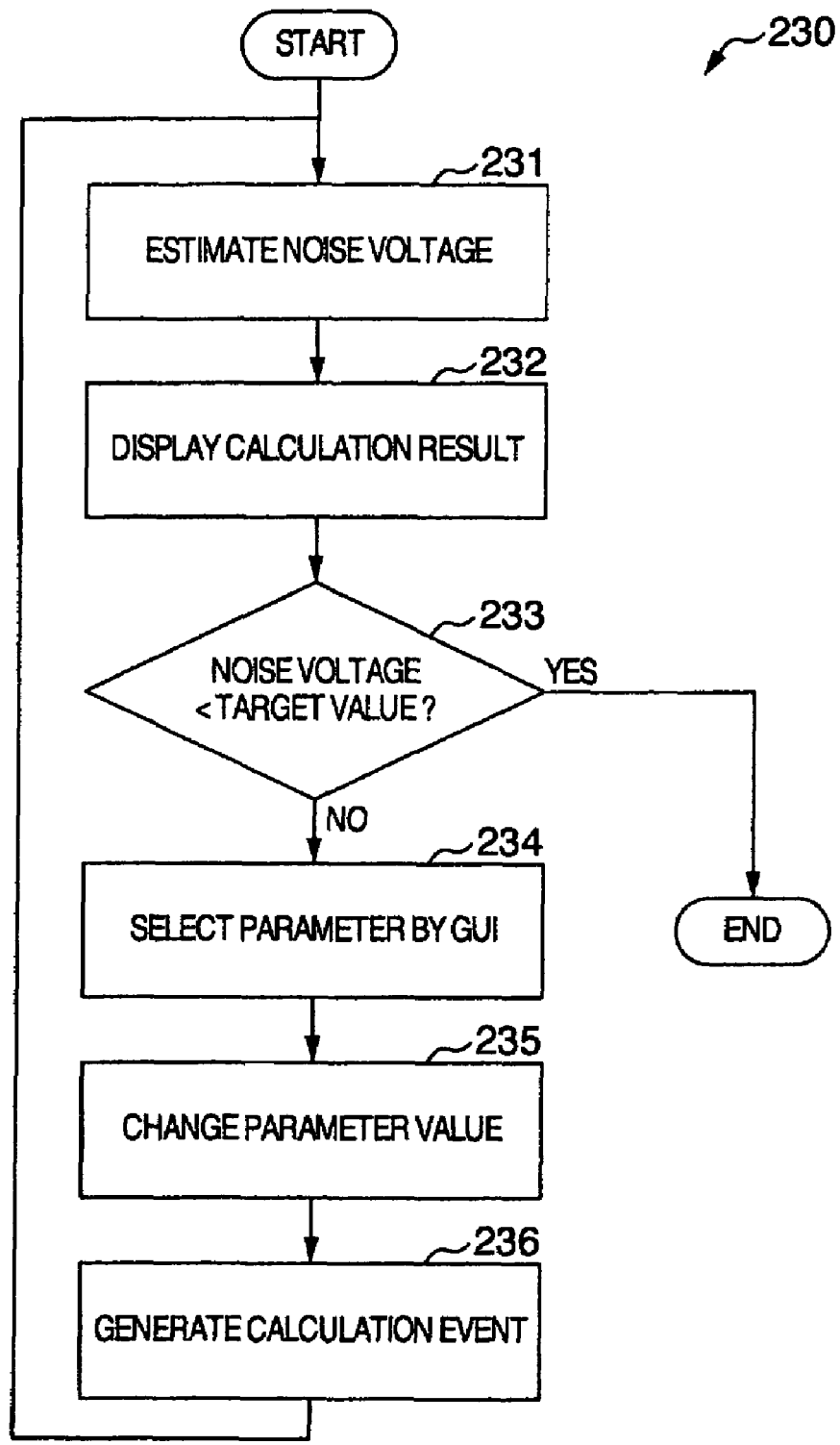
FIG. 16 is a flow chart illustrating a component rearranging method of the printed circuit board design method using GUI of the second embodiment.
Figure 17:
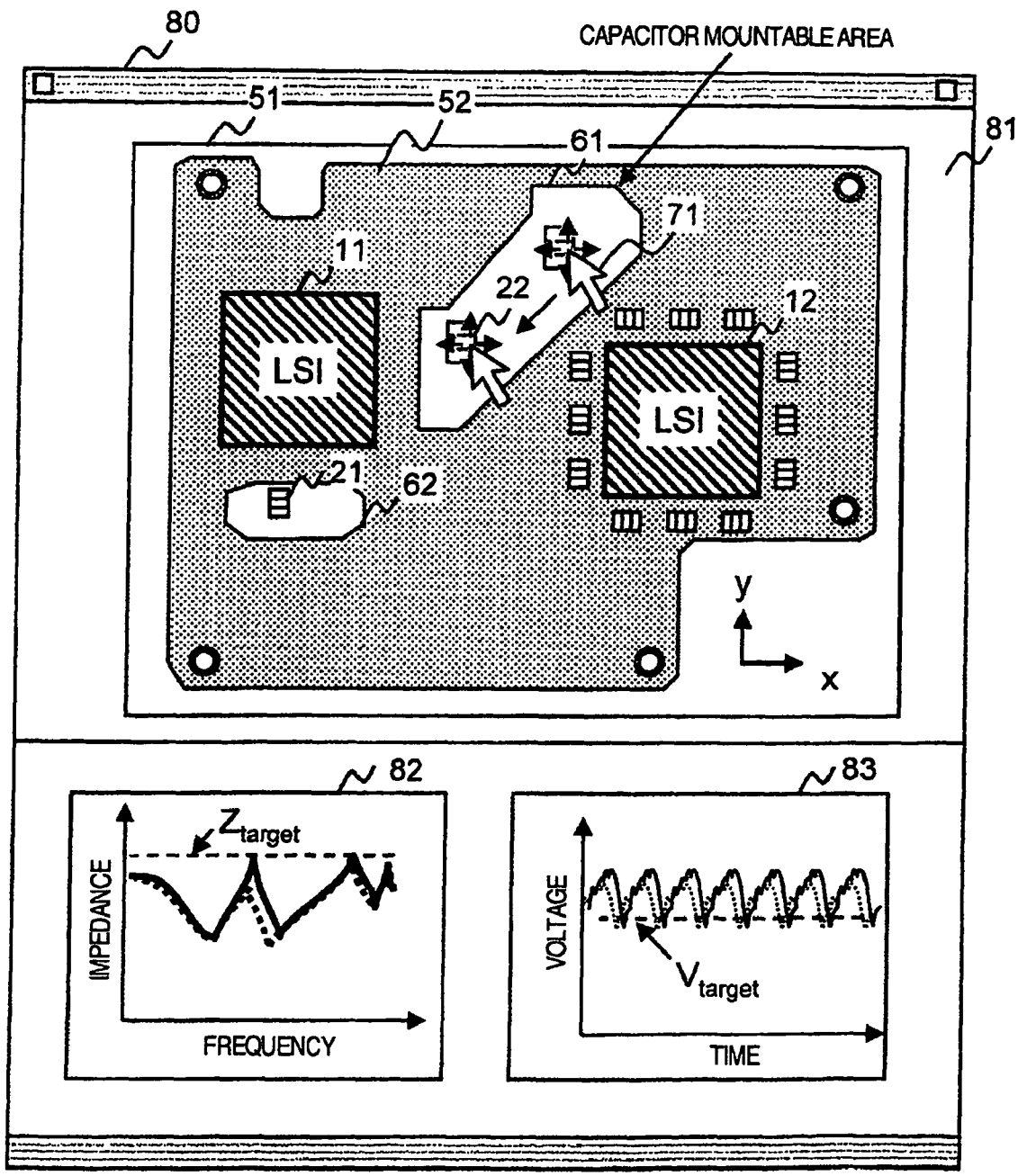
FIG. 17 is a GUI screen illustrating the printed circuit board design method of the second embodiment.

With reference to FIGS. 15, 16 and 17, the second embodiment will be described.

A different point of FIG. 15 from FIG. 1 resides in that a component rearranging process 230 is performed by using a graphical user interface (GUI). The detailed sequence of this process 230 is illustrated in FIG. 16. First, at Step 231, a noise voltage relative to component arrangement is estimated by using the estimation equation (1) similar to the first embodiment. Next, at Step 232, a calculation result is displayed as illustrated in FIG. 17. Namely, a working window 80 of an information processing apparatus constituting a design support system has screens of a board layout information area 81, an inductance information area 82 indicating a power source impedance and a waveform information area 83 indicating a voltage waveform. In the board information area 81, a power source layer pattern 52, semiconductor devices 11 and 12 and capacitors 21 and 22 are displayed in a printed circuit board 51. Mountable areas 61 and 62 for the decoupling capacitors 61 and 62 defined by the design rule are displayed as outline shapes with a white background. As a user selects the capacitor 22 with a mouse cursor 71 and moves the cursor along a lower left direction, waveforms in the impedance information area and waveform information area 83 change. The waveform in the area 82 changes from a solid line to a broken line. Since a power source impedance is represented by the estimation equation of a polynomial equation, a personal computer can calculate the power source impedance even during a time period of cursor motion. An impedance Z11(f) at a frequency (f) is calculated by the following equation:

$$Z11(f) = ZC2 // ZC3 // ZC4 // ZL3 // ZL4 \quad (7)$$

where a symbol "//" means a total impedance of parallel connection components. Each value of ZC2, ZC3, ZC4, ZL3 and ZL4 is formulated by a polynomial equation of each parameter set (p) like the equation (5). For example, ZC2 is expressed by the following polynomial equation:

$$ZC2 = a0 + \Sigma(a_i \cdot L\char`^ i + b_i \cdot t\char`^ i + c_i \cdot n\char`^ i) \quad (8)$$

where i=1 ... 2. The absolute values |Z11| at a plurality of frequencies (f) can be arithmetically calculated at high speed by using parameters of ZC2, ZC3, ZL3 or the like expressed by a polynomial equation.

The power source noise waveform Vgnd(t) can be calculated by:

$$Vgnd(t)=\Sigma(Z11(fi)\times I(fi)) \quad (9)$$

where i=1, ..., k. Namely, the power source noise waveform can be calculated by calculating a product of a current value of a noise current model and the power source impedance at each selected one of k antiresonance frequencies. This calculation is also arithmetic calculation using a polynomial equation, software allowing real time display can therefore be implemented.

Since the target impedance (Ztarget) is displayed in the area 82, a user can design an arrangement of the capacitor 22 to move near to the target. Similarly, as a noise voltage target value (Vtarget) is displayed, similar effects can be obtained.

The correspondence between each Step in FIG. 16 and an operation on the screen in FIG. 17 is as follows. A motion of component arrangement with a mouse corresponds to the parameter selection at Step 234 for component selection operation, and a motion of a component with the mouse corresponds to parameter value change (in this case, arrangement position) at Step 235 and to calculation event generation at Step 236. Although changing the size and type (t) of a capacitor by changing the parameter values at Step 235 is not illustrated in FIG. 17, this operation corresponds to selection from a component list with the mouse. The number (n) of capacitors can be increased by GUI operation. A designer sequentially adds a capacitor one by one to increase the number (n).

According to the second embodiment, even if a designer is not a skilled designer, the type, mount position and the number of decoupling capacitors can be selected by only the operation on the screen while the designer monitors the target power source impedance and voltage waveform, so that design can be completed in a short time. This can be achieved by using the estimation equation (5 or 6) without repeating circuit analysis at each component rearrangement.

Third Embodiment

Figure 18:
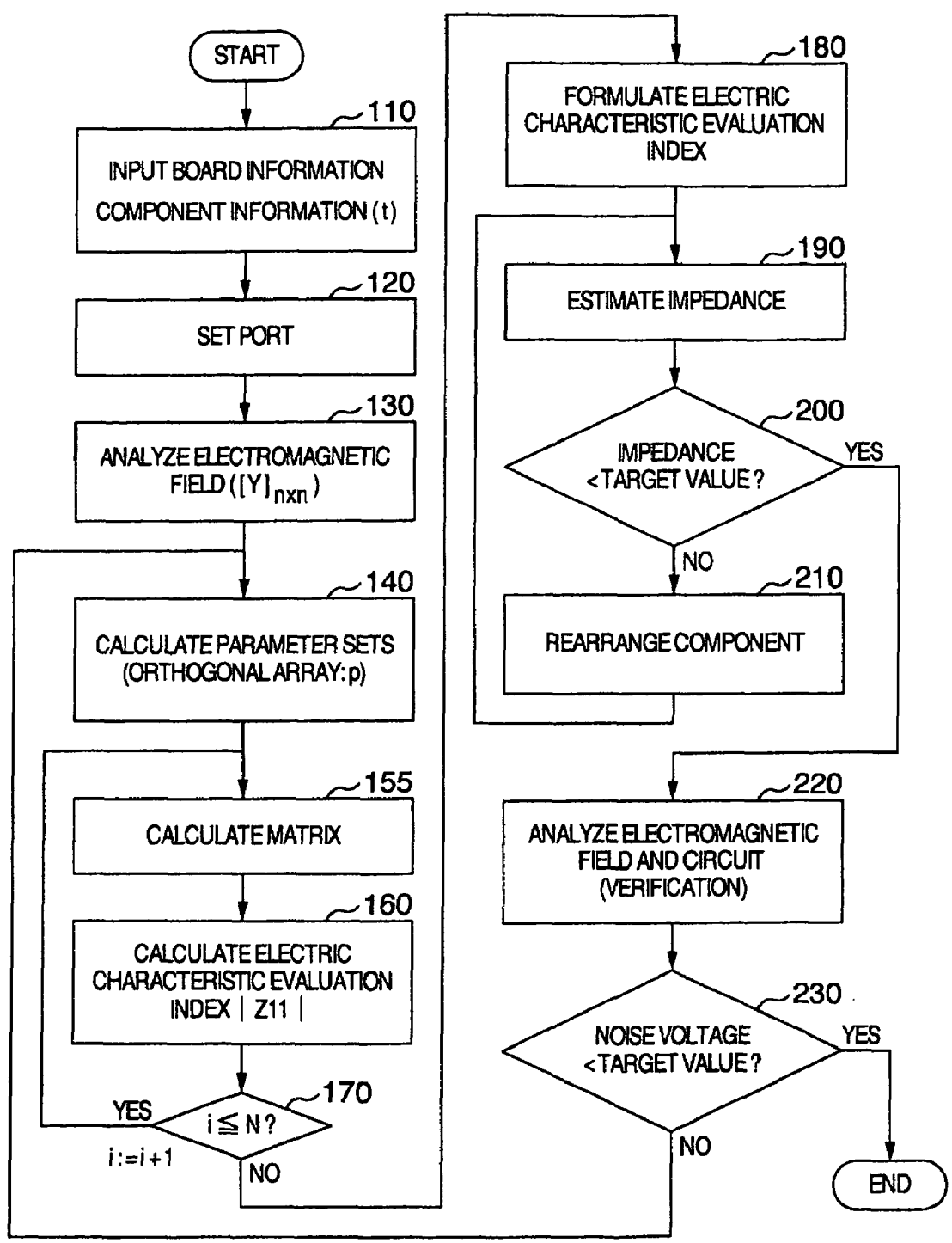
FIG. 18 is a design flow chart realizing a printed circuit board design method according to a third embodiment.
Figure 19:
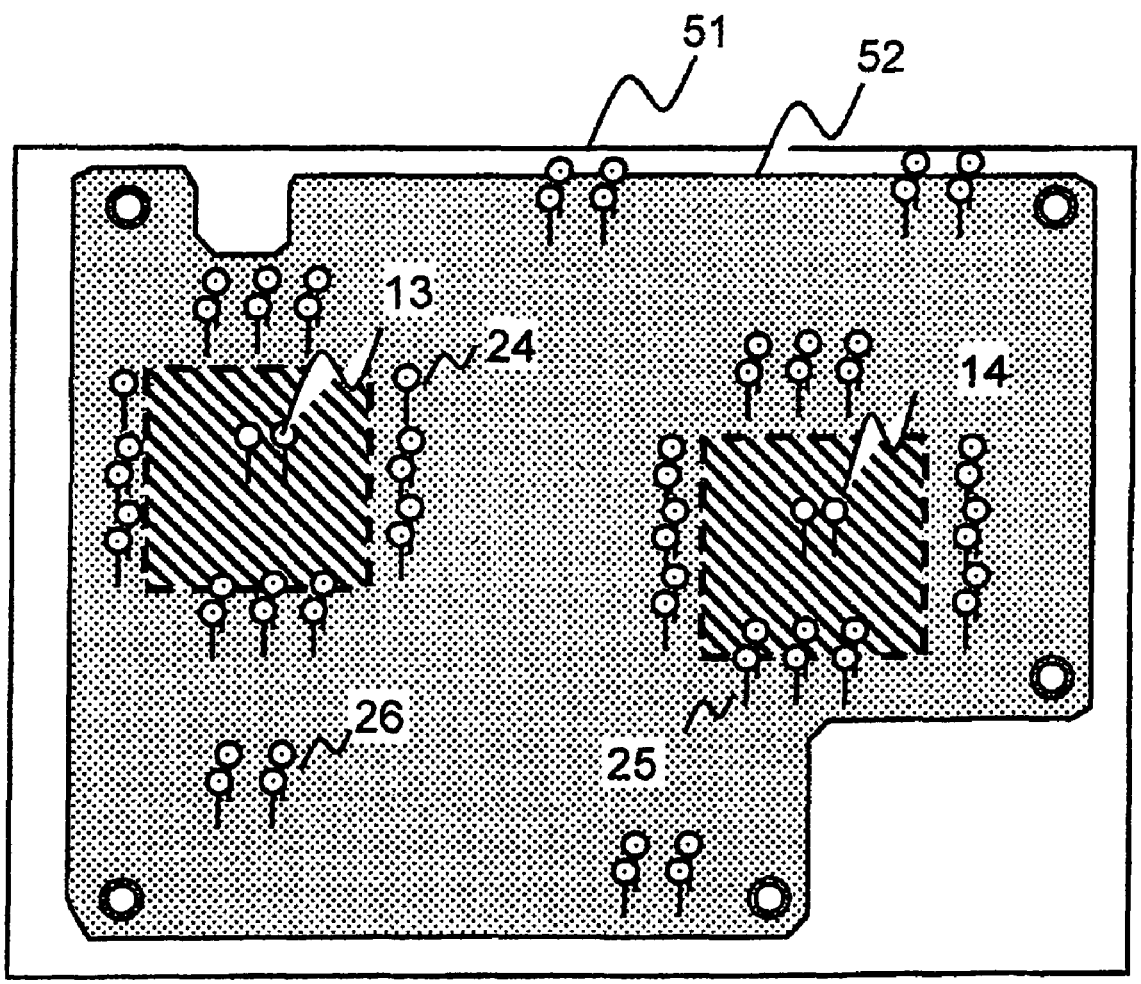
FIG. 19 is a plan view illustrating port settings for the printed circuit board design method of the third embodiment.

The third embodiment will be described by using FIGS. 18 and 19. A difference from the first embodiment resides in that electromagnetic analysis at Step 130 calculates not the inductance Lk but a Y parameter. Instead of circuit analysis at Step 160, a matrix calculation (at Step 155) is performed. The Y parameter is an admittance parameter and uses an admittance matrix of Y parameters at each frequency in the target frequency range. By using Y parameters instead of circuit calculations, it becomes advantageous that formulation of the electric characteristic evaluation index through repetition of Steps 150 to 170 of the first embodiment can be performed in a short time.

Description will be made on the reason why the calculation is speeded up more that the circuit calculation, by using Y parameters.

First, description will be made on how a change in the power feeding system impedance when a capacitor component is replaced is calculated. With this calculation approach, in the state that mount component information is not added to a target printed circuit board as illustrated in FIG. 19, analysis ports are set to LSI mount areas and capacitor component mount areas. In FIG. 19, two ports 13, 14 are set to the two LSI mount areas. These LSI ports, positive and negative ports, are assigned to the power source pad and ground pad in the central area of an LSI mount area, respectively. Also in FIG. 19, a number of ports 24 to 26 are set to the capacitor mount areas. Similar to the above, positive and negative ports are assigned to the power source pad and ground pad. The total number of ports is n=np+nt where np is the number of LSI ports and nt is the number of ports to be set to the capacitor areas. An admittance matrix [Y] n×n of a bare board can be grouped in the following manner:

$$[Y]nxn = \begin{vmatrix} [Y11]npxnp & [Y12]npxnt \\ [Y21]ntxnp & [Y22]ntxnt \end{vmatrix}_{nxn} \quad (10)$$

The Y parameters pf of a capacitor can be calculated easily from the equivalent circuit of the capacitor illustrated in FIG. 11. For example, if a circuit having an admittance Ya and a circuit having an admittance Yb are connected in parallel, the total admittance Y' of the whole circuit of the parallel circuit can be expressed as Y'=Ya+Yb. Therefore, the admittance Y' after the capacitor is connected can be calculated by a simple addition of two matrices, the electric characteristics Y of the printed circuit board indicated by the equation (10) and the matrix Yc expressing a combination of admittances of capacitors to be connected to respective capacitor ports, as in the following:

$$[Y']nxn = \begin{vmatrix} [Y11]npxnp & [Y12]npxnt \\ [Y21]ntxnp & [Y22]ntxnt \end{vmatrix}_{nxn} + \begin{vmatrix} [0]npxnp & [0]npxnt \\ [0]ntxnp & [Yc]ntxnt \end{vmatrix}_{nxn} \quad (11)$$

[0] represents a zero matrix, and [Yc] represents a diagonal matrix of decoupling capacitors.

In this manner, a plurality of capacitor admittance matrices Yc corresponding to the capacitor mount conditions are prepared and calculated on the basis of the parameter sets obtained at Step 140 to obtain the admittance matrix of the whole circuit corresponding to the capacitor mount conditions. Therefore, the Y parameters corresponding to various capacitor mount conditions as seen from each LSI can be obtained to calculate the Z11 from the Y parameters.

Although the Y parameters are used, other frequency parameters such as S parameters and Z parameters (impedance parameters) may also be used to perform similar matrix calculations.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A printed circuit board design support apparatus for determining arrangement of a semiconductor device and a decoupling capacitor connected to the semiconductor device on a printed circuit board, comprising:
    printed circuit board information inputting means for inputting layer structure information and outer shape information on the printed circuit board;
    component information inputting means for inputting a component list which includes power source ground information of the semiconductor device, electric characteristic information on a capacitor component of each type as a candidate for the decoupling capacitor, and the number of decoupling capacitors on the printed circuit board;
    component arrangement inputting means for inputting arrangement information of the semiconductor device and the decoupling capacitor on the printed circuit board, the arrangement information being determined based on the layer structure information and the outer shape information inputted in the printed circuit board information inputting means, the component list inputted in the component information inputting means, and a circuit connection information list and a wiring design rule which are prepared;

electromagnetic field analyzing means for performing electromagnetic analysis in accordance with the layer structure information, the outer shape information on the printed circuit board, the component list and the wiring design rule to calculate inductance network information;

inductance parameter calculating means for calculating inductance parameters from the inductance network information obtained by said electromagnetic field analyzing means and the arrangement information or decoupling capacitor inputted in the component arrangement inputting means;

parameter set calculating means for forming an orthogonal array from the calculated inductance parameters, type information of the decoupling capacitor and the number of mounted decoupling capacitors;

evaluation index calculating means for calculating an electric characteristic index by executing circuit-analysis based on the inductance network information calculated by said electromagnetic field analyzing means and the parameter sets of the orthogonal array formed by said parameter set calculating means;

evaluation equation calculating means for calculating an evaluation equation of a polynomial equation representing the electric characteristic index calculated by said evaluation index calculating means by using combinations of the parameters of the orthogonal array;

noise voltage estimating means for calculating a noise voltage of a power supply for the arrangement information inputted in the component arrangement inputting means by using the evaluation equation of the polynomial equation calculated by the evaluation equation calculating means; and decision means for comparing the noise voltage of the power supply calculated by the noise voltage estimating means to a predetermined target value of the noise voltage, wherein if the calculated noise voltage is higher than the target value of the noise voltage then the printed circuit board is rearranged by the component arrangement inputting means; and wherein the rearranged printed circuit board is repeatedly processed by the electromagnetic field analyzing means, the inductance parameter calculating means, the parameter set calculating means, the evaluation index calculating means, the evaluation equation calculating means and the noise voltage estimating means until the noise voltage of the power supply calculated by the noise voltage estimating means is less than the target value of the noise voltage of the power supply.

2. The printed circuit board design support apparatus according to claim 1, further comprising:
a component characteristic information database for the decoupling capacitor, wherein
said parameter set calculating means calculates the orthogonal array by using a maximum value, a minimum value and a median value of a parasitic capacitance of the decoupling capacitor registered in said component characteristic information database, as a range of the parameter of the decoupling capacitor.

3. The printed circuit board design support apparatus according to claim 1, further comprising:
a database for a design rule of the printed circuit board;
a component arrangement database;
calculating means for deriving a mountable area of the decoupling capacitor from said design rule data base and calculating shortest arrangement allowable coordinate values relative to the semiconductor device; and
calculating means for calculating a minimum inductance existing between the semiconductor device and the decoupling capacitor through contraction calculation by using power source pin coordinate values of the semiconductor device read from said component arrangement database, the calculated minimum arrangement allowable coordinate values, and a substrate inductance matrix,
wherein the orthogonal array is calculated by setting a maximum inductance to k times the minimum inductance where k is in a range of 1<k<10.

* * * * *